US011119874B2

(12) United States Patent
Song et al.

(10) Patent No.: US 11,119,874 B2
(45) Date of Patent: Sep. 14, 2021

(54) MEMORY FAULT DETECTION

(71) Applicant: Huawei Technologies Co., Ltd., Shenzhen (CN)

(72) Inventors: Gang Song, Dongguan (CN); Chengguo Ding, Shenzhen (CN); Fei Zhang, Hangzhou (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 16/748,274

(22) Filed: Jan. 21, 2020

(65) Prior Publication Data

US 2020/0159635 A1 May 21, 2020

Related U.S. Application Data

(63) Continuation of application No. PCT/CN2017/105071, filed on Sep. 30, 2017.

(51) Int. Cl.
*G06F 11/22* (2006.01)

(52) U.S. Cl.
CPC ...... *G06F 11/2273* (2013.01); *G06F 11/2205* (2013.01); *G06F 11/2268* (2013.01)

(58) Field of Classification Search
CPC .. G03F 7/70033; G03F 7/707; G03F 7/70908; G03F 7/70691; G03F 7/70941; G03F 7/70733; G03F 1/86; G03F 7/70825; G03F 7/70925; G03F 1/82; G03F 7/70708; H05G 2/008
USPC .......................................................... 714/25
See application file for complete search history.

(56) References Cited

U.S. PATENT DOCUMENTS

| | | | |
|---|---|---|---|
| 4,535,455 | A | 8/1985 | Peterson |
| 2001/0044917 | A1 | 11/2001 | Lester et al. |
| 2010/0223499 | A1 | 9/2010 | Panigrahy et al. |

(Continued)

FOREIGN PATENT DOCUMENTS

| | | | |
|---|---|---|---|
| CN | 101557121 | A | 10/2009 |
| CN | 103218275 | A | 7/2013 |
| CN | 103455283 | A | 12/2013 |

(Continued)

OTHER PUBLICATIONS

Gaorong, P., et al., "High-Speed Railway Insect Communication System," Apr. 2011, 30 pages.

(Continued)

*Primary Examiner* — Yair Leibovich
(74) *Attorney, Agent, or Firm* — Conley Rose, P.C.

(57) ABSTRACT

A memory fault detection method includes: receiving a first interrupt signal sent when a count value of a first leaky bucket counter of a server reaches a first threshold; disabling an interrupt switch of the first leaky bucket counter; enabling the interrupt switch of the first leaky bucket counter after the interrupt switch of the first leaky bucket counter has been disabled for a preset time and the count value of the first leaky bucket counter is reset to zero; receiving a second interrupt signal sent when a count value of a second leaky bucket counter reaches a second threshold; if the second leaky bucket counter and the first leaky bucket counter are a same leaky bucket counter, and the second rank and a first rank are a same rank, determining that a hardware fault occurs in the first rank.

20 Claims, 4 Drawing Sheets

(56) References Cited

U.S. PATENT DOCUMENTS

| | | | | |
|---|---|---|---|---|
| 2016/0048347 | A1* | 2/2016 | Rangarajan ............ | G11C 29/52 711/156 |
| 2016/0337267 | A1* | 11/2016 | Tzeng .................. | H04J 3/0661 |
| 2017/0091023 | A1 | 3/2017 | Gilda et al. | |
| 2017/0123879 | A1 | 5/2017 | Donlin | |
| 2017/0147416 | A1 | 5/2017 | Ranjan et al. | |

FOREIGN PATENT DOCUMENTS

| | | | |
|---|---|---|---|
| CN | 104317739 | A | 1/2015 |
| CN | 105117301 | A | 12/2015 |
| CN | 105426288 | A | 3/2016 |
| CN | 205881469 | U | 1/2017 |

OTHER PUBLICATIONS

Machine Translation and Abstract of Chinese Publication No. CN101557121, Oct. 14, 2009, 21 pages.

Machine Translation and Abstract of Chinese Publication No. CN103218275, Jul. 24, 2013, 21 pages.

Machine Translation and Abstract of Chinese Publication No. CN103455283, Dec. 18, 2013, 30 pages.

Machine Translation and Abstract of Chinese Publication No. CN104317739, Jan. 28, 2015, 11 pages.

Machine Translation and Abstract of Chinese Publication No. CN105117301, Dec. 2, 2015, 17 pages.

Machine Translation and Abstract of Chinese Publication No. CN105426288, Mar. 23, 2016, 6 pages.

Foreign Communication From A Counterpart Application, Chinese Application No. 201780039033.9, Chinese Office Action dated Nov. 29, 2019, 7 pages.

Foreign Communication From A Counterpart Application, Chinese Application No. 201780039033.9, Chinese Search Report dated Nov. 21, 2019, 2 pages.

Foreign Communication From A Counterpart Application, PCT Application No. PCT/CN2017/105071, English Translation of International Search Report dated Jun. 27, 2018, 3 pages.

* cited by examiner

MEMORY FAULT DETECTION

CROSS-REFERENCE TO RELATED APPLICATIONS

This is a continuation of Int'l Patent App. No. PCT/CN2017/105071 filed on Sep. 30, 2017, which is incorporated by reference.

TECHNICAL FIELD

This application relates to the field of server technologies, and more specifically, to a memory fault detection method and apparatus, and a server.

BACKGROUND

With development of server technologies, a memory configured in a server has an increasing capacity and runs at an increasingly high speed. In a running process of the server, a large quantity of memories running at a high speed are a high-risk zone of faults that most affects system stability in the server. If a hardware fault occurs in the memory in the server, continuous normal running of the server cannot be ensured.

Currently, an existing solution for identifying a memory fault in a server is: configuring a leaky bucket counter in the server; counting, by using the leaky bucket counter, a correctable error occurring in a memory in the server; and after a count value of the leaky bucket counter reaches a specific threshold, triggering an interrupt and giving a memory fault warning.

However, some memory faults are not hardware faults, but are soft faults (for example, bit inverting caused by a cosmic ray) or transient faults (for example, data line crosstalk). When these non-hardware faults occur, a correctable error may also be caused. In the existing solution, whether a correctable error is caused by a hardware fault or a non-hardware fault cannot be identified in a manner of giving a memory fault warning by using a leaky bucket counter, and therefore whether a hardware fault occurs in the memory cannot be accurately identified. Consequently, efficiency of another operation such as fault maintenance that is based on accurate hardware fault identification is affected, or a false fault alarm is generated.

SUMMARY

This application provides a memory fault detection method and apparatus, and a server, to more accurately determine a memory in which a hardware fault occurs.

According to a first aspect, a memory fault detection method is provided, and the method includes: receiving a first interrupt signal sent when a count value of a first leaky bucket counter of a server reaches a first threshold, where the first leaky bucket counter is used to count a correctable error occurring in a first rank corresponding to the first leaky bucket counter; disabling an interrupt switch of the first leaky bucket counter; enabling the interrupt switch of the first leaky bucket counter after the interrupt switch of the first leaky bucket counter has been disabled for a preset time and the count value of the first leaky bucket counter is reset to zero; receiving a second interrupt signal sent when a count value of a second leaky bucket counter reaches the second threshold, where the second leaky bucket counter is used to count a correctable error occurring in a second rank corresponding to the second leaky bucket counter; and if the second leaky bucket counter and the first leaky bucket counter are a same leaky bucket counter, and the second rank and the first rank are a same rank, determining that a hardware fault occurs in the first rank.

In this application, a memory in which a hardware fault occurs can be more accurately determined based on repeated determining (receiving an interrupt signal twice) and a time interval (an interrupt switch of a leaky bucket counter is disabled after an interrupt signal is received for the first time). Specifically, whether a hardware fault occurs in a rank corresponding to the leaky bucket counter is not directly determined after the interrupt signal of the leaky bucket counter is received for the first time. Instead, the interrupt switch of the leaky bucket counter is disabled for a period of time, a count value of the leaky bucket counter is reset to zero, and then the interrupt switch is enabled again. If the interrupt signal of the leaky bucket counter is received again, it is determined that a hardware fault occurs in the rank corresponding to the leaky bucket counter.

With reference to the first aspect, in some implementations of the first aspect, if the second leaky bucket counter and the first leaky bucket counter are a same leaky bucket counter, and the second rank and the first rank are a same rank, the method further includes: if the first interrupt signal is received, recording a memory chip that is in the first rank and in which a correctable error occurs; if the second interrupt signal is received, recording a memory chip that is in the first rank and in which a correctable error occurs; determining a quantity of times of recording the memory chip that is in the first rank and in which a correctable error occurs; and when a quantity of times of recording a first memory chip in the first rank reaches a predetermined quantity of times, determining that a hardware fault occurs in the first memory chip.

A specific level (a memory chip or an entire rank) in which a hardware fault occurs can be further determined by comparing a quantity of times of recording a memory chip with the predetermined quantity of times, so that targeted troubleshooting can be performed.

With reference to the first aspect, in some implementations of the first aspect, if the second leaky bucket counter and the first leaky bucket counter are a same leaky bucket counter, and the second rank and the first rank are a same rank, the method further includes: recording the first rank if the first interrupt signal is received; recording the first rank if the second interrupt signal is received; and determining a quantity of times of recording the first rank; and the determining that a hardware fault occurs in the first rank includes: if the quantity of times of recording the first rank reaches the predetermined quantity of times, determining that a hardware fault occurs in the first rank.

Whether a hardware fault actually occurs in the rank can be further determined by comparing a quantity of times of recording a rank with the predetermined quantity of times, thereby more accurately determining a memory in which a fault occurs.

With reference to the first aspect, in some implementations of the first aspect, if the second leaky bucket counter and the first leaky bucket counter are a same leaky bucket counter, and the second rank and the first rank are a same rank, the method further includes: recording a first memory module if the first interrupt signal is received, where the first memory module includes the first rank; recording the first memory module if the second interrupt signal is received; determining a quantity of times of recording the first memory module; and if the quantity of times of recording the first memory module reaches the predetermined quantity of times, determining that a hardware fault occurs in the first memory module.

Whether a hardware fault actually occurs in a memory module can be determined by comparing a quantity of times of recording a memory module with the predetermined quantity of times, so that a memory in which a fault occurs can be more accurately determined.

With reference to the first aspect, in some implementations of the first aspect, the first leaky bucket counter and the second leaky bucket counter are different leaky bucket counters, and the method further includes: recording a first memory module if the first interrupt signal is received, where the first memory module includes the first rank and the second rank; recording the first memory module if the second interrupt signal is received; determining a quantity of times of recording the first memory module; and if the quantity of times of recording the first memory module reaches a predetermined quantity of times, determining that a hardware fault occurs in the first memory module.

When the first leaky bucket counter and the second leaky bucket counter are different leaky bucket counters, whether a hardware fault actually occurs in a memory module can be determined by comparing a quantity of times of recording a memory module with the predetermined quantity of times, so that a memory in which a fault occurs can be more accurately determined.

With reference to the first aspect, in some implementations of the first aspect, if it is determined that a hardware fault occurs in the first memory chip, the method further includes: performing in-service replacement on the first memory chip in the first rank.

When a hardware fault occurs in the first memory chip, the first memory chip in which a hardware fault occurs is replaced through in-service replacement, so as to avoid a case in which the server cannot run normally because a hardware fault occurs in a memory chip in the first rank.

With reference to the first aspect, in some implementations of the first aspect, before the performing in-service replacement on the first memory chip, the method further includes: determining that a redundant memory chip exists in the first rank; and the performing in-service replacement on the first memory chip includes: performing in-service replacement on the first memory chip by using the redundant memory chip.

With reference to the first aspect, in some implementations of the first aspect, if it is determined that a hardware fault occurs in the first rank, the method further includes: performing in-service replacement on the first rank.

When a hardware fault occurs in the first rank, the first rank in which a hardware fault occurs is replaced through in-service replacement, to ensure normal running of the server.

With reference to the first aspect, in some implementations of the first aspect, before the performing in-service replacement on the first rank, the method further includes: determining that a redundant rank exists in a memory module in which the first rank is located; and the performing in-service replacement on the first rank includes: performing in-service replacement on the first rank by using the redundant rank.

With reference to the first aspect, in some implementations of the first aspect, the method further includes: resetting the count value of the first leaky bucket counter to zero.

The count value of the first leaky bucket counter is reset to zero, so that the leaky bucket counter restarts counting of a correctable error, to continue memory fault diagnosis.

With reference to the first aspect, in some implementations of the first aspect, if it is determined that a hardware fault occurs in the first memory module, the method further includes: giving a fault alarm, where the fault alarm is used to indicate that a hardware fault occurs in the first memory module.

The fault alarm can prompt a skilled person to perform replacement or other processing on a memory module in which a hardware fault occurs, to ensure normal running of the server.

With reference to the first aspect, in some implementations of the first aspect, a leaky bucket frequency of the first leaky bucket counter or the second leaky bucket counter is set based on memory access frequency in the server and frequency of occurrence of a correctable error in a memory in which a non-hardware fault (for example, a soft fault or a transient fault) occurs.

Specifically, when the leaky bucket frequency is being set, the leaky bucket frequency may be less than the memory access frequency and greater than the frequency of occurrence of the correctable error in the memory due to the non-hardware fault. For example, the leaky bucket frequency may be set to a value between 1 hertz (Hz) and 100 Hz.

With reference to the first aspect, in some implementations of the first aspect, the first threshold is determined based on duration of the non-hardware fault and the leaky bucket frequency.

According to a second aspect, a memory fault detection apparatus is provided, and the apparatus includes a module configured to perform the method in the first aspect or any possible implementation of the first aspect.

According to a third aspect, a memory fault detection apparatus is provided, including a storage, a transceiver, and a processor. The storage is configured to store a program, and the processor is configured to execute the program. When the program is executed, the processor and the transceiver perform the method in the first aspect or any possible implementation of the first aspect.

According to a fourth aspect, a server is provided, and the server includes the memory fault detection apparatus in the second aspect or the third aspect and a storage. The memory fault detection apparatus is configured to detect whether a hardware fault occurs in a memory in the storage, and the memory in the storage includes at least one of a memory module, a memory rank, and a memory chip.

According to a fifth aspect, a chip is provided, and the chip includes a processor and a communications interface. The communications interface is configured to communicate with an external component, and the processor is configured to perform the method in the first aspect or any possible implementation of the first aspect.

Optionally, in an implementation, the chip may further include a storage, the storage stores an instruction, and the processor is configured to execute the instruction stored in the storage. When the instruction is executed, the processor is configured to perform the method in the first aspect or any possible implementation of the first aspect.

DESCRIPTION OF EMBODIMENTS

To better understand a memory fault detection method in embodiments of this application, an application scenario of the embodiments of this application is first briefly described below with reference to FIG. 1.

Figure 1:
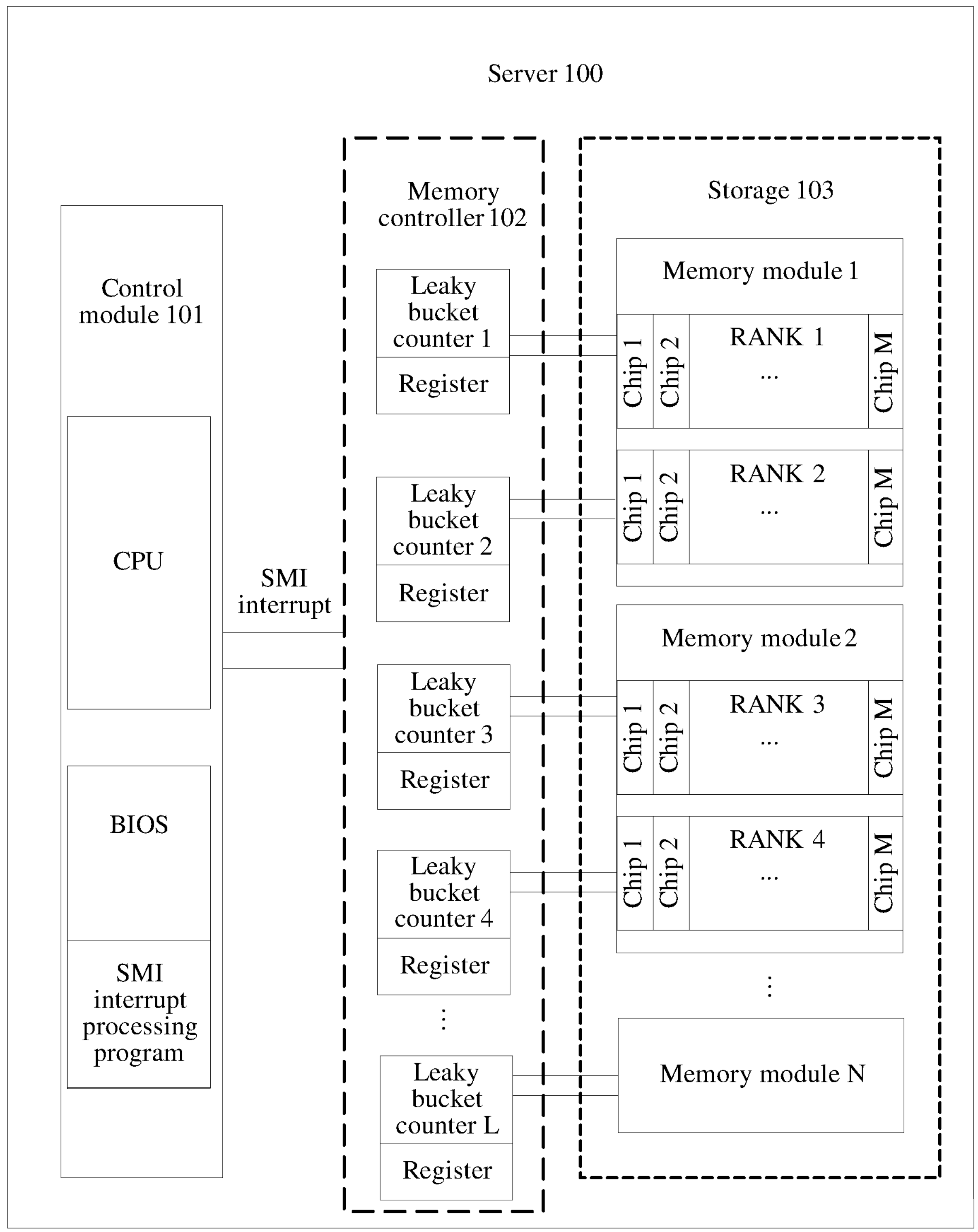
FIG. 1 is a schematic block diagram of a server according to an embodiment of this application.

FIG. 1 shows a server 100 according to an embodiment of this application. The server 100 includes a control module 101, a memory controller 102, and a storage 103. The control module 101 may include a central processing unit (CPU) and a basic input/output system (BIOS), and the BIOS may store an SMI interrupt processing program. The storage 103 includes a plurality of memory modules, each memory module includes two memory ranks (rank, where a memory rank is referred to as a rank below), and each rank includes a plurality of memory chips. It may be understood that in specific implementation, the memory module may also include a plurality of ranks, and this is not specifically limited in this application.

Specifically, the storage 103 includes a memory module 1 to a memory module N, the memory module 1 includes a rank 1 and a rank 2, and the memory module 2 includes a rank 3 and a rank 4. For the rank 1 to the rank 4, each rank includes a memory chip 1 to a memory chip M, where M may be 8, 16, or another value. It should be understood that memory chips with a same number in different ranks are different memory chips. For example, a memory chip 1 in the rank 1 represents a memory chip whose number is 1 in the rank 1, and a memory chip 1 in the rank 2 represents a memory chip whose number is 1 in the rank 2.

Usually, for each rank in the storage 103, the memory controller 102 has one leaky bucket counter corresponding to the rank. As shown in FIG. 1, leaky bucket counters corresponding to the rank 1 to the rank 4 are respectively a leaky bucket counter 1 to a leaky bucket counter 4, and each leaky bucket counter is used to count a correctable error occurring in a corresponding rank. In addition, a leaky bucket counter L in FIG. 1 corresponds to the last rank in the memory module N, and is used to count a correctable error occurring in the last rank in the memory module N. For each leaky bucket counter, the leaky bucket counter may further include a register. The register may record a number of a memory chip in which a correctable error occurs after a count value of the leaky bucket counter reaches a specific threshold, a number of a rank to which the memory chip in which a correctable error occurs belongs, a number of a memory module to which the memory chip in which a correctable error occurs belongs, and the like.

An SMI interrupt may be triggered when a count value that is of a correctable error and that is recorded by a leaky bucket counter reaches a specific threshold. In this case, the control module may record a memory chip, a rank, a memory module, and the like in which a correctable error occurs after the count value of the leaky bucket counter reaches the specific threshold. For example, when a count value that is of a correctable error and that is recorded by the leaky bucket counter 1 reaches a specific threshold, the leaky bucket counter 1 sends an interrupt signal to the control module, and the control module records the memory module 1 and the rank 1 in which a correctable error currently occurs and a memory chip that is in the rank 1 and in which a correctable error occurs.

It should be understood that in the server 100, a connection relationship (not shown in the figure) may exist between the control module 101 and the storage 103, so that the control module 101 stores data into the storage 103 or reads data from the storage 103. In addition, the server 100 may further include another module or unit. For brevity, FIG. 1 shows only three main modules: the control module 101, the memory controller 102, and the storage 103.

The memory fault detection method in the embodiments of this application may be applied to the server shown in FIG. 1. Specifically, the memory fault detection method in the embodiments of this application may be used to perform fault detection on a memory in the storage 103 in the server 100 in FIG. 1. It should be understood that the server shown in FIG. 1 is merely a specific scenario to which the embodiments of this application are applied. The embodiments of this application may be further applied to another memory fault detection scenario. An application scenario is not specifically limited in this application.

Figure 2:
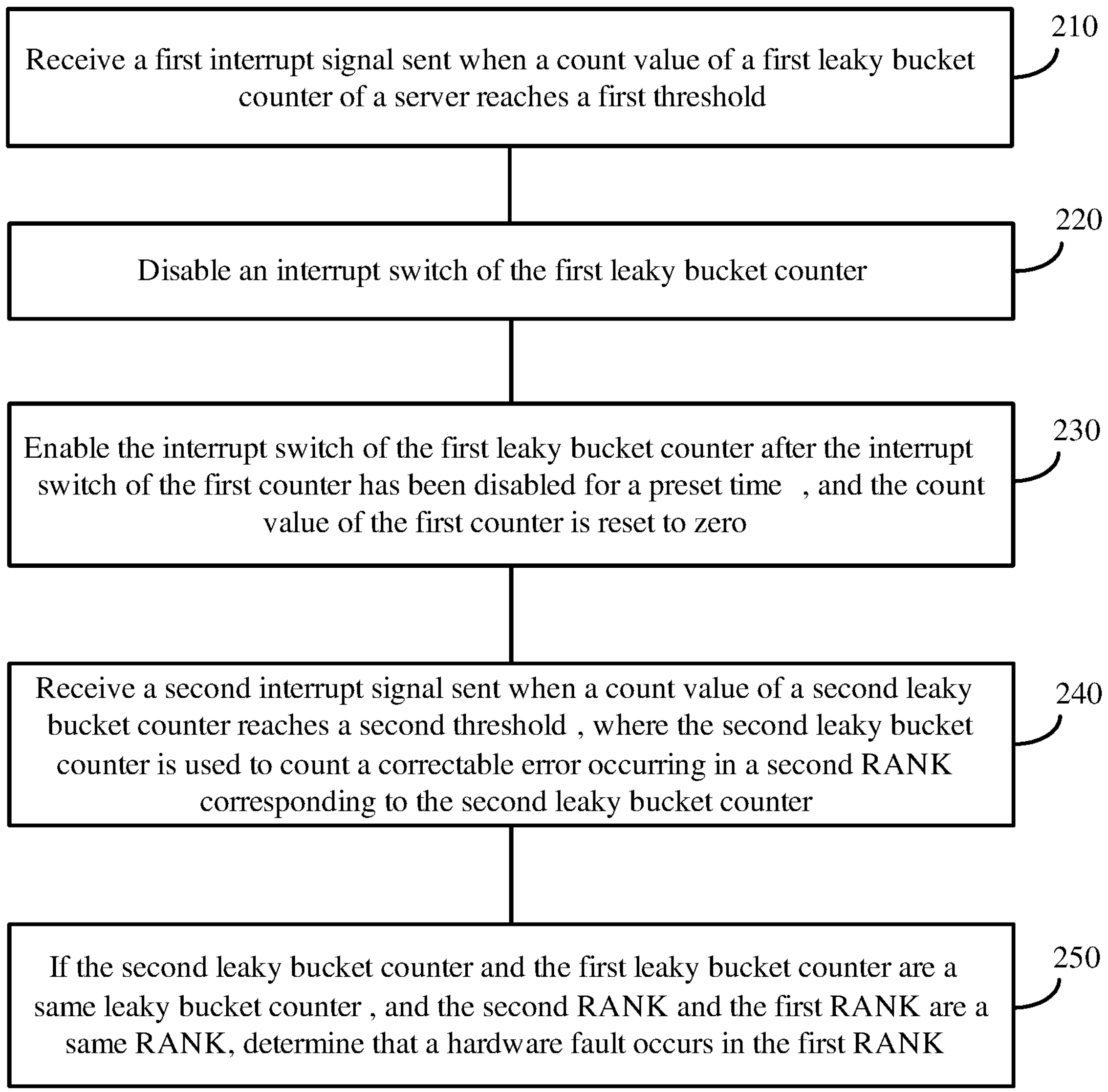
FIG. 2 is a schematic flowchart of a memory fault detection method according to an embodiment of this application.

FIG. 2 is a schematic flowchart of a memory fault detection method according to an embodiment of this application. The method shown in FIG. 2 may be performed by a control module or a control unit (in a server). For example, the method shown in FIG. 2 may be performed by the control module 101 in FIG. 1 or may be specifically performed by a CPU in the control module 101. Fault detection can be performed on the storage 103 by using the method shown in FIG. 2. The method shown in FIG. 2 specifically includes the following steps.

210. Receive a first interrupt signal sent when a count value of a first leaky bucket counter of a server reaches a first threshold, where the first leaky bucket counter is used to count a correctable error occurring in a first rank corresponding to the first leaky bucket counter.

It should be understood that the first leaky bucket counter may be any leaky bucket counter disposed in the server. For example, the first leaky bucket counter may be a counter leaky bucket 1 in the server 100 in FIG. 1, and is used to count a correctable error occurring in a rank 1. An interrupt signal is sent only when the count value of the first leaky bucket counter reaches the first threshold, and if the count value of the first leaky bucket counter is less than the first threshold, the first leaky bucket counter does not send an interrupt signal.

The server may include a plurality of leaky bucket counters, and each leaky bucket counter may correspond to one rank in the server. When the server runs, if a correctable error occurs in an accessed memory in the rank, the leaky bucket counter counts the correctable error occurring in the rank. When a count value of the leaky bucket counter reaches the first threshold, the leaky bucket counter triggers a system management interrupt (SMI), and sends an interrupt signal.

In addition, the leaky bucket counter may also be referred to as a memory correctable error leaky bucket counter or a memory leaky bucket counter or another name. A function of the leaky bucket counter is to count a correctable error occurring in the leaky bucket counter. For ease of description, the leaky bucket counter is uniformly used in this specification for description.

220. Disable an interrupt switch of the first leaky bucket counter.

It should be understood that, after the interrupt switch of the first leaky bucket counter is disabled, an interrupt signal cannot be sent even if the count value of the first leaky bucket counter reaches the first threshold. Therefore, after the interrupt switch of the first leaky bucket counter is disabled, the CPU can neither receive an interrupt signal sent by the first leaky bucket counter.

230. Enable the interrupt switch of the first leaky bucket counter after the interrupt switch of the first leaky bucket counter has been disabled for a preset time and the count value of the first leaky bucket counter is reset to zero.

After the first interrupt signal of the first leaky bucket counter is received, the interrupt switch of the first leaky bucket counter is disabled for a period of time, the count value of the first leaky bucket counter is reset to zero, and then the interrupt switch of the first leaky bucket counter is enabled again, so that a memory correctable error caused by a non-hardware fault (a soft fault or a transient fault) can be distinguished from a correctable error caused by a hardware fault.

Optionally, the preset time in step 230 is a preset fixed time interval, and the preset time may range from 10 seconds to 20 seconds. For example, the preset time may be 15 seconds, 18 seconds, or 20 seconds.

Optionally, a length of the preset time may be related to duration of a non-hardware fault (including a soft fault or a transient fault). If the duration of the non-hardware fault is relatively long, a relatively long preset time may be set. If the duration of the non-hardware fault is relatively short, a relatively short preset time may be set.

Specifically, a correctable error caused by a hardware fault usually reoccurs, but a correctable error caused by a non-hardware fault usually does not reoccur. Therefore, after an interrupt switch of a leaky bucket counter is disabled for a period of time (for example, 15 seconds), if an interrupt signal sent by the leaky bucket counter can still be received, it may be considered that a hardware fault occurs in a memory. However, after an interrupt switch of a leaky bucket counter is disabled for a period of time, if no interrupt signal sent by the leaky bucket counter is received, it may be considered that a non-hardware fault occurs in a memory.

In addition, disabling the interrupt switch of the leaky bucket counter may be specifically disabling an SMI of the leaky bucket counter. It may be understood that in this embodiment of this application, the interrupt switch of the leaky bucket counter may also be disabled by using other hardware or software. This is not limited in this application. When the interrupt switch is disabled, the leaky bucket counter cannot send an interrupt signal even if a count value of the leaky bucket counter reaches the first threshold. After the SMI of the leaky bucket counter has been disabled for the preset time, the SMI of the leaky bucket counter is enabled again, so that the leaky bucket counter can send an interrupt signal again after the count value of the leaky bucket counter reaches the first threshold.

240. Receive a second interrupt signal sent when a count value of a second leaky bucket counter reaches a second threshold, where the second leaky bucket counter is used to count a correctable error occurring in a second rank corresponding to the second leaky bucket counter. The first threshold and the second threshold may be a same threshold or different thresholds, and this is not specifically limited herein.

250. If the first leaky bucket counter and the second leaky bucket counter are a same leaky bucket counter, and the second rank and the first rank are a same rank, determine that a hardware fault occurs in the first rank.

For example, as shown in FIG. 1, when both the first leaky bucket counter and the second leaky bucket counter are the leaky bucket counter 1 in FIG. 1 and both the first rank and the second rank are the rank 1 in FIG. 1, it is determined that a hardware fault occurs in the rank 1 in FIG. 1.

In this application, a memory in which a hardware fault occurs can be more accurately determined based on repeated determining (receiving an interrupt signal twice) and a time interval (an interrupt switch of a leaky bucket counter is disabled after an interrupt signal is received for the first time). Specifically, whether a hardware fault occurs in a rank corresponding to the leaky bucket counter is not directly determined after the interrupt signal of the leaky bucket counter is received for the first time. Instead, the interrupt switch of the leaky bucket counter is disabled for a period of time, a count value of the leaky bucket counter is reset to zero, and then the interrupt switch is enabled again. If the interrupt signal of the leaky bucket counter is received again, it is determined that a hardware fault occurs in the rank corresponding to the leaky bucket counter.

After a rank in which a hardware fault occurs is determined based on a plurality of times of repeated determining and a time interval, whether a hardware fault occurs in a memory chip, a rank, or a memory module may be further determined by recording a quantity of times for which a correctable error occurs in a rank, a memory chip, and a memory module corresponding to a leaky bucket counter each time when a count value of the leaky bucket counter reaches the first threshold, to determine a specific level of a memory in which a hardware fault occurs.

In addition, in step 210 to step 250, the first leaky bucket counter and the second leaky bucket counter may correspond to different thresholds. Specifically, the first interrupt signal is sent when the count value of the first leaky bucket counter reaches the first threshold, and the second interrupt signal is sent when the count value of the second leaky bucket counter reaches the second threshold.

A specific leaky bucket frequency and a specific leaky bucket threshold are usually set for a leaky bucket counter. The leaky bucket frequency is a value that needs to be subtracted from a leaky bucket count value each second. For example, when the leaky bucket frequency of the leaky bucket counter is 20, 20 is subtracted from the count value of the leaky bucket counter each second. Because a correctable error caused by a soft fault infrequently occurs, a high leaky bucket frequency is set, so that occurrence of a case in which the count value of the leaky bucket counter is continuously higher than the leaky bucket threshold can be reduced. In addition, the correctable error caused by the soft fault usually does not reoccur. Therefore, after an interrupt signal is received, and an interrupt switch has been disabled for a preset time, if an interrupt signal sent by a same leaky bucket counter is received next time, it can be accurately identified whether a hardware fault occurs in a memory in the server.

The purpose of setting the leaky bucket threshold is to trigger sending of an interrupt signal when the count value of the leaky bucket counter reaches the leaky bucket threshold, so as to record a memory in which a correctable error occurs. For example, the leaky bucket threshold is 6000. When the count value of the leaky bucket counter reaches 6000, the leaky bucket counter sends an interrupt signal to record the memory in which a correctable error occurs.

It should be understood that, both the first threshold and the second threshold in step 210 and step 240 may be considered as leaky bucket thresholds of leaky bucket counters.

During memory fault detection, the leaky bucket threshold of the leaky bucket counter may be set based on an accuracy requirement of fault diagnosis. When the accuracy requirement of the fault diagnosis is relatively high, a larger leaky bucket threshold may be set. When the accuracy requirement of the fault diagnosis is relatively low, a smaller leaky bucket threshold may be set.

In addition, during memory fault detection, the leaky bucket frequency may be set based on memory access frequency in the server and frequency of occurrence of a correctable error caused by a non-hardware fault (a soft fault and a transient fault). Specifically, when the leaky bucket frequency is being set, the leaky bucket frequency may be less than the memory access frequency and greater than the frequency of occurrence of the correctable error in the memory due to the non-hardware fault (for example, a soft fault). For example, the leaky bucket frequency may be set to a value between 1 Hz and 100 Hz.

Therefore, the leaky bucket threshold and the leaky bucket frequency of the leaky bucket counter may be set based on an actual requirement of the memory fault detection.

When the leaky bucket threshold of the leaky bucket counter is being set (the leaky bucket threshold is equivalent to the foregoing first threshold, and the leaky bucket counter sends an interrupt signal when a quantity of times for which a correctable error occurs reaches the leaky bucket threshold), the leaky bucket threshold may be determined based on duration of a non-hardware fault and the leaky bucket frequency. Specifically, time duration may be set. If a length of the time duration is greater than the duration of the non-hardware fault, a product of the time duration and the leaky bucket frequency is determined as the leaky bucket threshold of the leaky bucket counter. Alternatively, a multiple parameter is set based on accuracy and coverage requirements during the memory fault detection, and a product of the duration, the multiple parameter, and the leaky bucket frequency is determined as the leaky bucket threshold of the leaky bucket counter.

For example, if the leaky bucket frequency of the leaky bucket counter is 1 Hz, the duration is 60 seconds, and the multiple parameter is 100, the leaky bucket threshold is 6000.

Optionally, when the second leaky bucket counter and the first leaky bucket counter are a same leaky bucket counter, and the first rank and the second rank are a same rank, the method shown in FIG. 2 further includes: if the first interrupt signal is received, recording a memory chip that is in the first rank and in which a correctable error occurs; if the second interrupt signal is received, recording a memory chip that is in the first rank and in which a correctable error occurs; determining a quantity of times of recording the memory chip that is in the first rank and in which a correctable error occurs; and when a quantity of times of recording a first memory chip in the first rank reaches a predetermined quantity of times, determining that a hardware fault occurs in the first memory chip.

It should be understood that recording the memory chip that is in the first rank and in which a correctable error occurs is specifically recording a memory chip that is in the first rank and in which a correctable error occurs when the count value of the first leaky bucket counter reaches the first threshold, for example, recording a number of the memory chip.

For example, the predetermined quantity of times is 3. If the count value of the leaky bucket counter 1 in FIG. 1 reaches the first threshold consecutively three times, and a chip 1 in the rank 1 is recorded three times, it may be determined that a hardware fault occurs in the chip 1 in the rank 1 in FIG. 1.

A specific level (a memory chip or an entire rank) in which a hardware fault occurs can be further determined by comparing a quantity of times of recording a memory chip with the predetermined quantity of times, so that targeted troubleshooting can be performed.

When the count value of the first leaky bucket counter reaches the first threshold, the first leaky bucket counter stores, in an internal register (as shown in FIG. 1, each leaky bucket counter includes one register), information about a memory chip in which a correctable error currently occurs. Specifically, a number of the memory chip in which a correctable error currently occurs may be directly recorded, so that a number of the memory chip that is in the first rank and in which a correctable error occurs can be recorded by querying the register in the first leaky bucket counter.

The predetermined quantity of times may be an integer greater than or equal to 2. For example, the predetermined quantity of times is specifically 2. If the first memory chip in the first rank is recorded twice, it is determined that a hardware fault occurs in the first memory chip in the first rank, and therefore it is determined that a hardware fault specifically occurs in the first memory chip in the first rank.

Each time when the count value of a leaky bucket counter reaches the first threshold, the leaky bucket counter may record a rank in which a correctable error occurs in addition to a memory chip in which a correctable error occurs.

Optionally, when the first leaky bucket counter and the second leaky bucket counter are a same leaky bucket counter, and the first rank and the second rank are a same rank, the method shown in FIG. 2 further includes: recording the first rank if the first interrupt signal is received; recording the first rank if the second interrupt signal is received; and determining a quantity of times of recording the first rank; and the determining that a hardware fault occurs in the first rank specifically includes: if the quantity of times of recording the first rank reaches the predetermined quantity of times, determining that a hardware fault occurs in the first rank.

For example, if both the first leaky bucket counter and the second leaky bucket counter are the leaky bucket counter 1 shown in FIG. 1, both the first rank and the second rank are the rank 1 shown in FIG. 1, and a quantity of times of recording the rank 1 reaches the predetermined quantity of times, it is determined that a hardware fault occurs in the rank 1.

Whether a hardware fault actually occurs in the rank can be further determined by comparing a quantity of times of recording a rank with the predetermined quantity of times, thereby more accurately determining a memory in which a fault occurs.

It should be understood that when a count value of a leaky bucket counter reaches the first threshold, if only a rank corresponding to the leaky bucket counter is recorded and once a quantity of times of recording the rank reaches the predetermined quantity of times, it may be determined that a hardware fault occurs in the rank.

For example, the predetermined quantity of times is 2, and if the first rank is recorded twice, it may be determined that a hardware fault occurs in the first rank.

In addition, when a count value of a leaky bucket counter (the leaky bucket counter may be the first leaky bucket counter or the second leaky bucket counter) reaches the leaky bucket threshold, if both a rank corresponding to the leaky bucket counter and a memory chip that is in the rank and in which a correctable error occurs are recorded, it may be first determined whether a quantity of times of recording a memory chip in the rank corresponding to the leaky bucket counter reaches the predetermined quantity of times. When a quantity of times of recoding a memory chip reaches the predetermined quantity of times, it is determined that a hardware fault occurs in the memory chip. If a quantity of times of recording any memory chip in the rank corresponding to the leaky bucket counter does not reach the predetermined quantity of times, it is then determined whether a quantity of times of recoding the rank corresponding to the leaky bucket counter reaches the predetermined quantity of times. If the quantity of times of recoding the rank corresponding to the leaky bucket counter reaches the predetermined quantity of times, it is determined that a hardware fault occurs in the rank corresponding to the leaky bucket counter.

For example, the predetermined quantity of times is specifically 2. The first memory chip in the first rank is recorded twice, and the first rank is also recorded twice. However, because a same memory chip is recorded consecutively twice, it may be directly determined that a hardware fault occurs in the first memory chip. As shown in FIG. 1, if the rank 1 is recorded twice, and the chip 1 in the rank 1 is also recorded twice, it may be determined that a hardware fault occurs in the chip 1 in the rank 1.

For example, the predetermined quantity of times is still 2. The first memory chip in the first rank is recorded once, a second memory chip in the first rank is recorded once, and the first rank is recorded twice. In this case, because neither the quantity of times of recording the first memory chip nor the quantity of times of recording the second chip reaches the predetermined quantity of times, and only the quantity of times of recording the first rank reaches the predetermined quantity of times, it is determined that a hardware fault occurs in the first rank. As shown in FIG. 1, if the chip 1 in the rank 1 is recorded once, a chip 2 in the rank 1 is recorded once, and the rank 1 is recorded twice, it is determined that a hardware fault occurs in the rank 1.

Each time when the count value of a leaky bucket counter reaches the first threshold, the leaky bucket counter may record a memory module in which a correctable error occurs in addition to a rank in which a correctable error occurs.

Optionally, when the first leaky bucket counter and the second leaky bucket counter are a same leaky bucket counter, and the first rank and the second rank are a same rank, the method shown in FIG. 2 further includes: recording a first memory module if the first interrupt signal is received, where the first memory module includes the first rank; recording the first memory module if the second interrupt signal is received; determining a quantity of times of recording the first memory module; and if the quantity of times of recording the first memory module reaches the predetermined quantity of times, determining that a hardware fault occurs in the first memory module.

Whether a hardware fault actually occurs in a memory module can be determined by comparing a quantity of times of recording a memory module with the predetermined quantity of times, so that a memory in which a fault occurs can be more accurately determined.

Optionally, when the first leaky bucket counter and the second leaky bucket counter are different leaky bucket counters, that is, the first leaky bucket counter and the second leaky bucket counter respectively correspond to two different ranks in a memory module, and the first memory module includes the first rank and the second rank, the method shown in FIG. 2 further includes: recording a first memory module if the first interrupt signal is received; recording the first memory module if the second interrupt signal is received; determining a quantity of times of recording the first memory module; and when the quantity of times of recording the first memory module reaches a predetermined quantity of times, determining that a hardware fault occurs in the first memory module.

When the first leaky bucket counter and the second leaky bucket counter are different leaky bucket counters, whether a hardware fault actually occurs in a memory module can be determined by comparing a quantity of times of recording a memory module with the predetermined quantity of times, so that a memory in which a fault occurs can be more accurately determined.

For example, it is assumed that the first leaky bucket counter is the leaky bucket counter 1 in FIG. 1, and the second leaky bucket counter is the leaky bucket counter 2 in FIG. 1. A memory module 1 needs to be recorded both after receiving interrupt signals of the leaky bucket counter 1 and after receiving interrupt signals of the leaky bucket counter 2. When a quantity of times of recording the memory module 1 reaches the predetermined quantity of times, it is determined that a hardware fault occurs in the memory module 1.

It should be understood that in this application, when a count value of a leaky bucket counter reaches the first threshold, a memory module, a rank, and a memory chip in which a correctable error currently occurs may be recorded. Specifically, numbers of the memory module, the rank, and the memory chip in which a correctable error currently occurs may be recorded. For example, as shown in FIG. 1, when a count value of the leaky bucket counter 1 reaches the first threshold, if a correctable error occurs in the chip 1 in the rank 1, the memory module 1, the rank 1, and the chip 1 in the rank 1 may be recorded.

For example, the count value of the leaky bucket counter 1 in FIG. 1 reaches the first threshold three times, and a memory chip in which a correctable error occurs each time when the count value of the leaky bucket counter 1 reaches the first threshold is the chip 1 in the rank 1. The chip 1 is recorded each time when the count value of the leaky bucket counter 1 reaches the first threshold, and therefore the chip 1 is recorded three times. Similarly, a correctable error occurs in the rank 1 and the memory module 1 each time when the count value of the leaky bucket counter 1 reaches the first threshold, and the rank 1 and the memory module 1 are also recorded three times.

It should be understood that, determining quantities of times of recording a memory module, a rank, and a memory chip may be specifically determining quantities of times of consecutively recording the memory module, the rank, and the memory chip.

For example, if the count value of the leaky bucket counter 1 in FIG. 1 reaches the first threshold consecutively three times, a memory chip in which a correctable error occurs when the count value of the leaky bucket counter 1 reaches the first threshold for the first two times is the chip 1 in the rank 1, and a memory chip in which a correctable error occurs when the count value of the leaky bucket counter 1 reaches the first threshold for the third time is the chip 2 in the rank 1, both the chip 1 and the chip 2 are recorded consecutively once. Because no correctable error occurs in the chip 1 when the count value of the leaky bucket counter 1 reaches the threshold for the third time, a quantity of times of consecutively recording the chip 1 may be set to 1, or a quantity of times of consecutively recording the chip 1 may be set to 0. In the foregoing case, although correctable errors do not occur in a same memory chip when the count value of the leaky bucket counter 1 reaches the first threshold consecutively three times, correctable errors occur in both the memory module 1 and the rank 1 when the count value of the leaky bucket counter 1 reaches the first threshold consecutively three times. Therefore, the rank 1 and the memory module 1 are recorded consecutively three times.

A correctable error caused by a memory hardware fault usually has the following three features:

(1) The correctable error caused by the memory hardware fault may usually reoccur, and an error is usually reported when a faulty memory is accessed.

(2) The correctable error caused by the memory hardware fault has relatively high frequency of occurrence.

Because a memory is usually accessed at relatively high frequency, a correctable error usually occurs when a memory in which a hardware fault occurs is accessed (or a memory area affected by a memory hardware fault is accessed), and the correctable error has relatively high frequency of occurrence.

(3) There is a relatively large quantity of correctable errors caused by the memory hardware fault.

Because access traffic is relatively large (which is usually at a K level or an M level) each time when the memory is accessed, a quantity of correctable errors caused when a hardware fault occurs in the accessed memory is also relatively large.

Usually, a correctable error caused by a soft fault or a transient fault does not have the foregoing three features. For example, the soft fault and the transient fault usually do not reoccur easily. The correctable error caused by the soft fault or the transient fault usually does not have high frequency of occurrence, and a quantity of correctable errors caused by the soft fault is usually small.

In the memory fault detection method in this embodiment of this application, a specific level of a memory in which a hardware fault occurs is determined by using the foregoing three features (which may be specifically one or more of the foregoing three features) of the correctable error caused by the hardware fault. Specifically, in the memory fault detection method in this embodiment of this application, the feature (1) may be met through a plurality of times of repeated determining (whether a correctable error consecutively occurs), the feature (2) is met by setting a proper leaky bucket frequency (for example, the leaky bucket frequency is set to 1 Hz), and the feature (3) is met by setting a proper first threshold (for example, the first threshold is set to 6000).

Further, the specific level of the memory in which a hardware fault occurs may be further accurately determined based on quantities of times of recording a same memory module, a same rank, and a same memory chip.

Optionally, in an embodiment, if it is determined that a hardware fault occurs in the first memory chip in the first rank, the method shown in FIG. 2 further includes: performing in-service replacement on the first memory chip.

When a hardware fault occurs in the first memory chip, the first memory chip in which a hardware fault occurs is replaced through in-service replacement, so as to avoid a case in which the server cannot run normally because a hardware fault occurs in a memory chip in the first rank.

In this application, a more accurate and proper memory fault processing measure can be taken because whether a memory in which a hardware fault occurs is a memory chip or a rank can be more accurately determined.

Optionally, in an embodiment, before in-service replacement is performed on the first memory chip, the method shown in FIG. 2 further includes: determining that a redundant memory chip exists in the first rank. In this case, the performing in-service replacement on the first memory chip specifically includes: performing in-service replacement on the first memory chip by using the redundant memory chip.

Specifically, the determining whether a redundant memory chip exists in the first rank may be specifically determining whether a redundant parity memory chip exists in the first rank. If there is a redundant parity memory chip, it may be determined that a redundant memory chip exists in the first rank. For example, if a parity memory chip in the first rank does not store parity data, it may be considered that the parity memory chip in the first rank is a redundant memory chip.

In addition, in some cases, if a memory chip in the first rank does not store data, the memory chip may also be determined as a redundant memory chip.

For example, a hardware fault occurs in the first memory chip in the first rank, and a parity chip in the first rank is not used. In this case, a memory controller may replace the first memory chip in the first rank with the parity chip in the first, and migrate data originally stored in the first memory chip to the parity chip in the first rank.

Specifically, as shown in FIG. 1, when a hardware fault occurs in the chip 1 in the rank 1, if a chip M in the rank 1 is a parity memory chip, and the chip M in the rank 1 does not store parity data, the chip M in the rank 1 is a redundant memory chip. In this case, the chip 1 may be replaced with the chip M, and data originally stored in the chip 1 is migrated to the chip M. In addition, when the chip 2 in the rank 1 is a non-parity memory chip, but the chip 2 in the rank 1 does not store data, the chip 2 in the rank 1 is also a redundant chip. In this case, the chip 1 may be replaced with the chip 2, and data originally stored in the chip 1 is migrated to the chip 2.

Optionally, in an embodiment, if it is determined that a hardware fault occurs in the first rank, the method shown in FIG. 2 further includes: performing in-service replacement on the first rank.

When a hardware fault occurs in the first rank, the first rank in which a hardware fault occurs is replaced through in-service replacement, to ensure normal running of the server.

Optionally, in an embodiment, before in-service replacement is performed on the first rank, the method shown in FIG. 2 further includes: determining that a redundant rank exists in a memory module in which the first rank is located. In this case, the performing in-service replacement on the first rank specifically includes: performing in-service replacement on the first rank by using the redundant rank.

Specifically, when another idle rank that does not store data exists in the memory module in which the first rank is located, it may be determined that a redundant rank exists in the memory module in which the first rank is located.

The performing in-service replacement on the first rank may be specifically: replacing the first rank with the redundant rank under control of the memory controller, and migrating data originally stored in the first rank to the redundant rank.

For example, as shown in FIG. 1, if a hardware fault occurs in the rank 1 and the rank 2 does not store data, the rank 2 is determined as a redundant rank, the rank 1 may be replaced with the rank 2, and data originally stored in the rank 1 is migrated to the rank 2.

Optionally, the redundant rank may be an idle rank specified during system initialization.

Optionally, when a hardware fault occurs in the first memory chip or a hardware fault occurs in the first rank, the method shown in FIG. 2 further includes: resetting the count value of the first leaky bucket counter to zero.

After it is determined that a hardware fault occurs in a memory chip in the first rank or a hardware fault occurs in the first rank, the count value of the first leaky bucket counter is reset to zero, so that the first leaky bucket counter can recount a correctable error occurring in the first rank, so as to restart memory fault diagnosis.

It should be understood that, after a count value of a leaky bucket counter is reset to zero, the leaky bucket counter can continue to count a correctable error occurring in a corresponding rank. When the count value of the leaky bucket counter reaches the leaky bucket threshold, an interrupt signal is sent to the control module. After receiving the interrupt signal, the control module records a memory in which a correctable error occurs when the count value of the leaky bucket counter reaches the leaky bucket threshold.

Disabling an interrupt switch of the leaky bucket counter does not change the count value of the leaky bucket counter, and does not affect counting by the leaky bucket counter. After the interrupt switch of the leaky bucket counter is disabled, the leaky bucket counter cannot send an interrupt signal to the control module even if the count value of the leaky bucket counter reaches the leaky bucket threshold. Therefore, the control module cannot record the memory in which a correctable error occurs when the count value of the leaky bucket counter reaches the leaky bucket threshold.

Optionally, when a hardware fault occurs in the first memory module, the method shown in FIG. 2 further includes: giving a fault alarm, where the fault alarm is used to indicate that a hardware fault occurs in the first memory module.

The fault alarm can prompt a skilled person to perform replacement or other processing on a memory module in which a hardware fault occurs, to ensure normal running of the server.

The fault alarm may be specifically generated in a management interface of a baseboard management controller (BMC), and is used to notify a skilled person that a hardware fault has occurred in the first memory module, and the skilled person may replace, based on the indication of the fault alarm, the memory module in which a hardware fault occurs.

In addition, when a hardware fault occurs in the first memory module, a leaky bucket counter corresponding to each rank in the first memory module may be permanently disabled, so that these leaky bucket counters no longer count a correctable error.

It should be understood that permanently disabling the leaky bucket counter corresponding to each rank in the first memory module herein may be disabling an interrupt switch of the leaky bucket counter corresponding to each rank in the first memory module until the first memory module in which a hardware fault occurs is replaced with another memory module, and then an interrupt switch of a leaky bucket counter corresponding to each rank in the replaced memory module is enabled again.

Permanent disabling of a corresponding leaky bucket counter can avoid interference to a controller in the server caused when the leaky bucket counter continuously sends an interruption signal, reduce occupation of server resources, and improve running efficiency of the server.

To better understand the memory fault detection method in the embodiments of this application, the memory fault detection method in the embodiments of this application is described below in detail with reference to FIG. 3.

Figure 3:
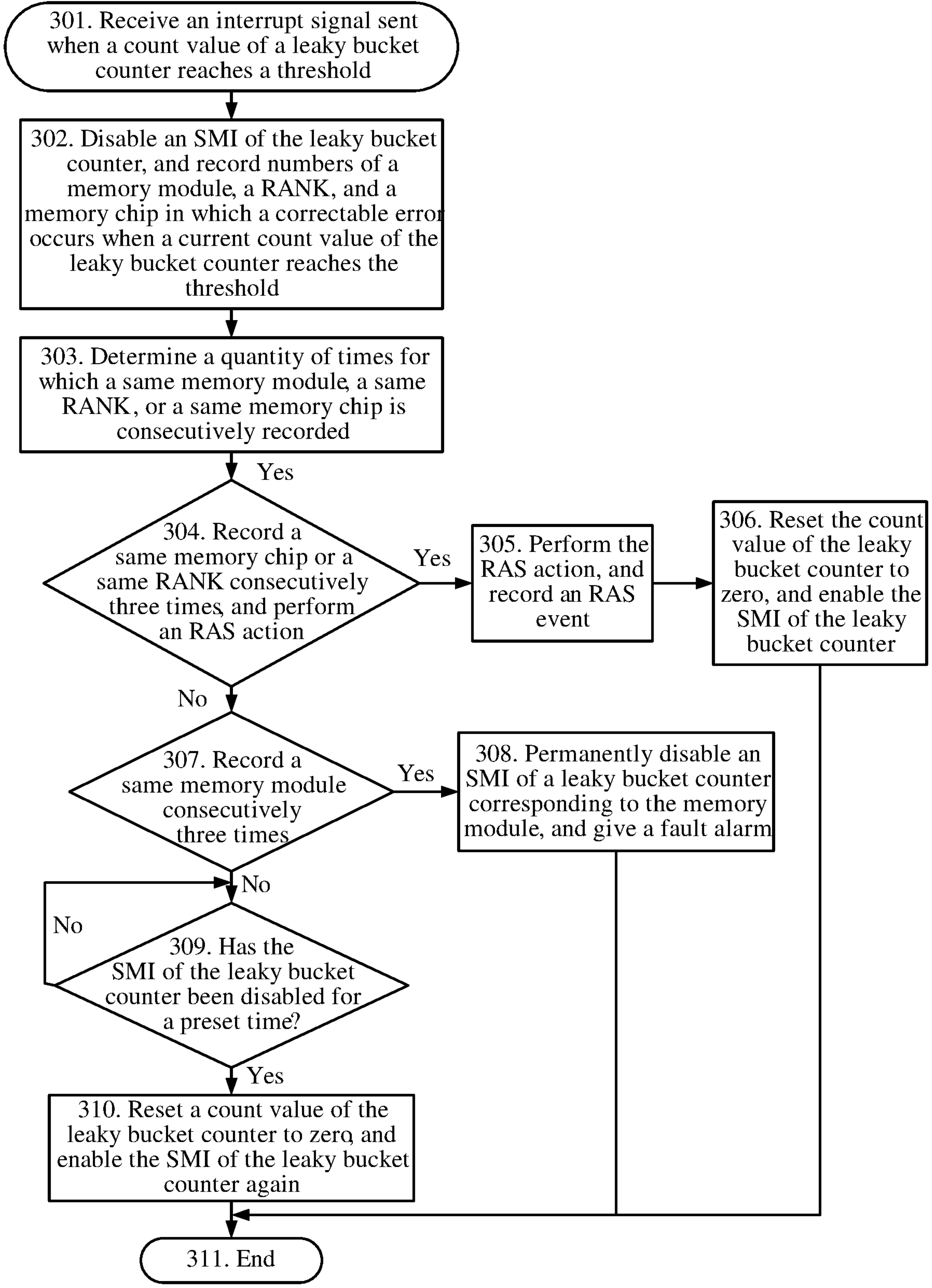
FIG. 3 is a schematic flowchart of a memory fault detection method according to an embodiment of this application.

FIG. 3 is a flowchart of a memory fault detection method according to an embodiment of this application. The method in FIG. 3 may be performed by a CPU in a server. The method in FIG. 3 specifically includes the following steps.

301. Receive an interrupt signal sent when a count value of a leaky bucket counter reaches a threshold.

The leaky bucket counter may be a leaky bucket counter corresponding to any rank in the server, and is used to count a quantity of times for which a correctable error occurs in the rank. The threshold may be a preset threshold, and the threshold may be specifically 6000.

302. Disable an SMI of the leaky bucket counter, and record numbers of a memory module, a rank, and a memory chip in which a correctable error occurs when a current count value of the leaky bucket counter reaches the threshold.

It should be understood that when the count value of the leaky bucket counter reaches the threshold, the leaky bucket counter sends an interrupt signal to a control module in the server.

For example, a first leaky bucket counter corresponds to a first rank. When a count value of the first leaky bucket counter reaches the threshold, a correctable error occurs in a first memory chip in the first rank. In this case, a number of the first memory chip, a number of the first rank, and a number of a memory module in which the first rank is located may be recorded.

303. Determine a quantity of times of consecutively recording a same memory module, a same rank, or a same memory chip.

For example, if a correctable error occurring in each of a first memory module, the first rank, and the first memory chip has been recorded consecutively twice before step 302, and in step 302, a correctable error occurs in the first memory module, the first rank, and a second memory chip when the count value of the leaky bucket counter reaches the threshold, it is determined that the first memory module is recorded consecutively three times, the first rank is recorded consecutively three times, and the second memory chip is recorded consecutively once. Because the first memory chip is not recorded in step 302, a quantity of times of consecutively recording a correctable error occurring in the first memory chip is no longer determined in step 303. That is, in step 303, only a quantity of times of consecutively recording a memory module/rank/memory chip in step 302 is determined.

304. Record a same memory chip or a same rank consecutively three times, and perform a reliability, availability, and serviceability (RAS) action.

For example, if the first memory chip is recorded consecutively three times, or the first rank is recorded consecutively three times, and the RAS action can be performed, step 305 is performed. If both a same memory chip and a same rank are recorded consecutively less than three times, or when the RAS action cannot be performed even if a same memory chip or a same rank is recorded consecutively three times, step 307 is performed.

Determining whether the RAS action can be performed may be specifically determining whether there is a redundant memory chip or a redundant rank. If there is a redundant memory chip or a redundant rank, it is determined that the RAS action can be performed. The RAS action herein includes performing in-service replacement on a memory (a rank or a memory chip), and the like.

305. Perform the RAS action, and record an RAS event.

Specifically, when the first memory chip is recorded consecutively three times, it may be considered that a hardware fault occurs in the first memory chip, and an in-service replacement operation may be performed on the first memory chip, to replace the first memory chip in which a hardware fault occurs.

When the first rank is recorded consecutively three times, it may be considered that a hardware fault occurs in the first rank, and an in-service replacement operation may be performed on the first rank, to replace the first rank in which a hardware fault occurs.

306. Reset the count value of the leaky bucket counter to zero, and enable the SMI of the leaky bucket counter.

After an in-service replacement operation is performed on a memory chip or a rank, the count value of the leaky bucket counter may be reset to zero, and the SMI of the leaky bucket counter may be enabled again, so that the counter leaky bucket can restart counting of a correctable error. In addition, when the count value of the leaky bucket counter reaches the threshold again, the leaky bucket counter can record a memory module, a rank, and a memory chip again in which a correctable error occurs.

307. Determine whether a same memory module is recorded consecutively three times.

When a same memory module is recorded consecutively three times, step 308 is performed; otherwise, step 309 is performed.

For example, the first memory chip is recorded consecutively twice, the first rank is recorded consecutively twice, and the first memory module is recorded consecutively three times. Because both a same memory chip and a same rank are recorded consecutively less than three times, a memory chip or a rank in which a hardware fault occurs cannot be determined. However, because the first memory module is recorded three times, it can be considered that a hardware fault occurs in the first memory module.

308. Permanently disable an SMI of a leaky bucket counter corresponding to the memory module, and give a memory module fault alarm.

Specifically, when the first memory module is recorded consecutively three times, it may be considered that a hardware fault occurs in the first memory module. In this case, an SMI of a leaky bucket counter corresponding to each rank in the first memory module may be permanently disabled, and a fault alarm is given to a BMC, to indicate that a (severe) hardware fault occurs in the first memory module.

309. Determine whether the SMI of the leaky bucket counter has been disabled for a preset time.

When the SMI of the leaky bucket counter has been disabled for the preset time, step 310 is performed. When the SMI of the leaky bucket counter has not been disabled for the preset time, the leaky bucket counter keeps waiting until the SMI of the leaky bucket counter has been disabled for the preset time.

310. Reset a count value of the leaky bucket counter to zero, and enable the SMI of the leaky bucket counter again.

When the SMI of the leaky bucket counter has been disabled for the preset time, the SMI of the leaky bucket counter is enabled again. In this case, when the count value of the counter leaky bucket reaches the threshold again, the SMI of the leaky bucket counter may be disabled again, and a memory module, a rank, and a memory chip in which a correctable error currently occurs are recorded.

311. End.

The memory fault detection method in the embodiments of this application is described above in detail with reference to FIG. 1 to FIG. 3. A memory fault detection apparatus in the embodiments of this application is described below in detail with reference to FIG. 4 and FIG. 5. It should be understood that the apparatuses in FIG. 4 and FIG. 5 can implement the memory fault detection method in the embodiments of this application shown in FIG. 2 and FIG. 3. For brevity, repeated descriptions are appropriately omitted below.

Figure 4:
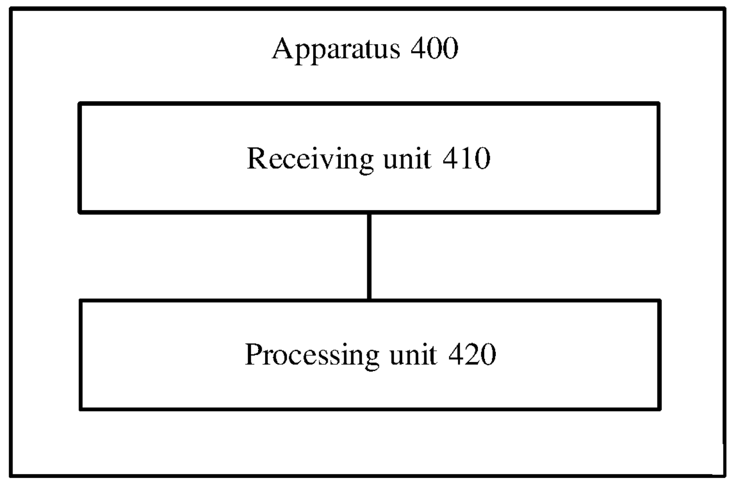
FIG. 4 is a schematic block diagram of a memory fault detection apparatus according to an embodiment of this application.

FIG. 4 is a schematic block diagram of a memory fault detection apparatus according to an embodiment of this application. An apparatus 400 in FIG. 4 includes: a receiving unit 410 configured to receive a first interrupt signal sent when a count value of a first leaky bucket counter of a server reaches a first threshold, where the first leaky bucket counter is used to count a correctable error occurring in a first rank corresponding to the first leaky bucket counter; and a processing unit 420 configured to disable an interrupt switch of the first leaky bucket counter.

The processing unit 420 is further configured to enable the interrupt switch of the first leaky bucket counter after the interrupt switch of the first leaky bucket counter has been disabled for a preset time and the count value of the first leaky bucket counter is reset to zero.

The receiving unit 410 is further configured to receive a second interrupt signal sent when a count value of a second leaky bucket counter reaches a second threshold, where the second leaky bucket counter is used to count a correctable error occurring in a second rank corresponding to the second leaky bucket counter.

The processing unit 420 is further configured to: if the second leaky bucket counter and the first leaky bucket counter are a same leaky bucket counter, and the second rank and the first rank are a same rank, determine that a hardware fault occurs in the first rank.

A function of the receiving unit 410 in the apparatus 400 corresponds to step 210 and step 240, and the receiving unit 410 can perform actions in step 210 and step 240. A function of the processing unit 420 in the apparatus 400 corresponds to step 220, step 230, and step 250, and the processing unit 420 can perform actions in step 220, step 230, and step 250.

In addition, the apparatus 400 may be specifically an apparatus that has a control function and that is disposed in the server. For example, the apparatus 400 may be the control module 101 in the server shown in FIG. 1.

In addition, the apparatus 400 may be an independent device disposed outside the server, or may be a module that is directly integrated into the server, and is configured to perform memory fault detection on a memory in the server.

In this application, a memory in which a hardware fault occurs can be more accurately determined based on repeated determining (receiving an interrupt signal twice) and a time interval (an interrupt switch of a leaky bucket counter is disabled after an interrupt signal is received for the first time). Specifically, whether a hardware fault occurs in a rank corresponding to the leaky bucket counter is not directly determined after the interrupt signal of the leaky bucket counter is received for the first time. Instead, the interrupt switch of the leaky bucket counter is disabled for a period of time, a count value of the leaky bucket counter is reset to zero, and then the interrupt switch is enabled again. If the interrupt signal of the leaky bucket counter is received again, it is determined that a hardware fault occurs in the rank corresponding to the leaky bucket counter.

Optionally, in an embodiment, if the second leaky bucket counter and the first leaky bucket counter are a same leaky bucket counter, and the second rank and the first rank are a same rank, the processing unit 420 is further configured to: if the first interrupt signal is received, record a memory chip that is in the first rank and in which a correctable error occurs; if the second interrupt signal is received, record a memory chip that is in the first rank and in which a correctable error occurs; determine a quantity of times of recording the memory chip that is in the first rank and in which a correctable error occurs; and when a quantity of times of recording a first memory chip in the first rank reaches a predetermined quantity of times, determine that a hardware fault occurs in the first memory chip.

Optionally, in an embodiment, if the second leaky bucket counter and the first leaky bucket counter are a same leaky bucket counter, and the second rank and the first rank are a same rank, the processing unit 420 is further configured to: record the first rank if the first interrupt signal is received; record the first rank if the second interrupt signal is received; determine a quantity of times of recording the first rank; and if the quantity of times of recording the first rank reaches the predetermined quantity of times, determine that a hardware fault occurs in the first rank.

Optionally, in an embodiment, if the second leaky bucket counter and the first leaky bucket counter are a same leaky bucket counter, and the second rank and the first rank are a same rank, the processing unit 420 is further configured to: record a first memory module if the first interrupt signal is received, where the first memory module includes the first rank; record the first memory module if the second interrupt signal is received; determine a quantity of times of recording the first memory module; and if the quantity of times of recording the first memory module reaches the predetermined quantity of times, determine that a hardware fault occurs in the first memory module.

Optionally, in an embodiment, the first leaky bucket counter and the second leaky bucket counter are different leaky bucket counters, and the processing unit 420 is further configured to: record the first memory module if the first interrupt signal is received, where the first memory module includes the first rank and the second rank; record the first memory module if the second interrupt signal is received; determine a quantity of times of recording the first memory module; and if the quantity of times of recording the first memory module reaches a predetermined quantity of times, determine that a hardware fault occurs in the first memory module.

Optionally, in an embodiment, if it is determined that a hardware fault occurs in the first memory chip, the processing unit 420 is further configured to perform in-service replacement on the first memory chip.

Optionally, in an embodiment, the processing unit 420 is further configured to: before performing in-service replacement on the first memory chip, determine that a redundant memory chip exists in the first rank; and perform in-service replacement on the first memory chip by using the redundant memory chip.

Optionally, in an embodiment, if it is determined that a hardware fault occurs in the first rank, the processing unit 420 is further configured to perform in-service replacement on the first rank.

Optionally, in an embodiment, the processing unit 420 is further configured to: before performing in-service replacement on the first rank, determine that a redundant rank exists in a memory module in which the first rank is located; and perform in-service replacement on the first rank by using the redundant rank.

Optionally, in an embodiment, the processing unit 420 is further configured to reset the count value of the first leaky bucket counter to zero.

Optionally, in an embodiment, if it is determined that a hardware fault occurs in the first memory module, the processing unit 420 is further configured to give a fault alarm, where the fault alarm is used to indicate that a hardware fault occurs in the first memory module.

Figure 5:
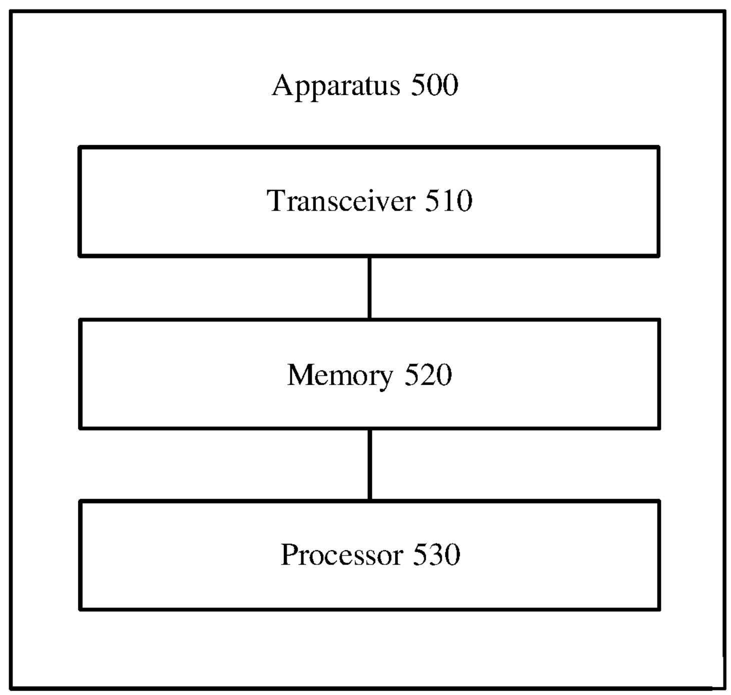
FIG. 5 is a schematic block diagram of a memory fault detection apparatus according to an embodiment of this application.

FIG. 5 is a schematic block diagram of a memory fault apparatus according to an embodiment of this application. An apparatus 500 in FIG. 5 includes: a transceiver 510 configured to receive a first interrupt signal sent when a count value of a first leaky bucket counter of a server reaches a first threshold, where the first leaky bucket counter is used to count a correctable error occurring in a first rank corresponding to the first leaky bucket counter; a storage 520 configured to store a program; and a processor 530 configured to execute the program stored in the storage 520, where when the program in the storage is executed, the processor 530 is further configured to: disable an interrupt switch of the first leaky bucket counter after the first interrupt signal sent when the count value of the first leaky bucket counter reaches the first threshold is received; enable the interrupt switch of the first leaky bucket counter after the interrupt switch of the first leaky bucket counter has been disabled for a preset time and the count value of the first leaky bucket counter is reset to zero; receive a second interrupt signal sent when a count value of a second leaky bucket counter reaches a second threshold, where the second leaky bucket counter is used to count a correctable error occurring in a second rank corresponding to the second leaky bucket counter; and if the second leaky bucket counter and the first leaky bucket counter are a same leaky bucket counter, and the second rank and the first rank are a same rank, determine that a hardware fault occurs in the first rank.

A function of the transceiver 510 in the apparatus 500 corresponds to step 210 and step 240, and the transceiver 510 can perform actions in step 210 and step 240. A function of the processor 530 in the apparatus 500 corresponds to step 220, step 230, and step 250, and the processor 530 can perform actions in step 220, step 230, and step 250.

In addition, the apparatus 500 may be specifically an apparatus that has a control function and that is disposed in the server. For example, the apparatus 500 may be the control module 101 in the server shown in FIG. 1.

In this application, a memory in which a hardware fault occurs can be more accurately determined based on repeated determining (receiving an interrupt signal twice) and a time interval (an interrupt switch of a leaky bucket counter is disabled after an interrupt signal is received for the first time). Specifically, whether a hardware fault occurs in a rank corresponding to the leaky bucket counter is not directly determined after the interrupt signal of the leaky bucket counter is received for the first time. Instead, the interrupt switch of the leaky bucket counter is disabled for a period of time, a count value of the leaky bucket counter is reset to zero, and then the interrupt switch is enabled again. If the interrupt signal of the leaky bucket counter is received again, it is determined that a hardware fault occurs in the rank corresponding to the leaky bucket counter.

Optionally, a part of the program stored in the storage 520 is stored in a BIOS, and the other part of the program is stored in another memory in the server. The program stored in the BIOS may be a program that is related to generation of an interrupt of a leaky bucket counter and sending of an interrupt signal, and the other part of the program stored in the another memory in the server may be a program related to determining of a hardware fault.

Optionally, in an embodiment, if the second leaky bucket counter and the first leaky bucket counter are a same leaky bucket counter, and the second rank and the first rank are a same rank, the processor 530 is further configured to: if the first interrupt signal is received, record a memory chip that is in the first rank and in which a correctable error occurs; if the second interrupt signal is received, record a memory chip that is in the first rank and in which a correctable error occurs; determine a quantity of times of recording the memory chip that is in the first rank and in which a correctable error occurs; and when a quantity of times of recording a first memory chip in the first rank reaches a predetermined quantity of times, determine that a hardware fault occurs in the first memory chip.

Optionally, in an embodiment, if the second leaky bucket counter and the first leaky bucket counter are a same leaky bucket counter, and the second rank and the first rank are a same rank, the processor 530 is further configured to: record the first rank if the first interrupt signal is received; record the first rank if the second interrupt signal is received; determine a quantity of times of recording the first rank; and if the quantity of times of recording the first rank reaches the predetermined quantity of times, determine that a hardware fault occurs in the first rank.

Optionally, in an embodiment, if the second leaky bucket counter and the first leaky bucket counter are a same leaky bucket counter, and the second rank and the first rank are a same rank, the processor 530 is further configured to: record a first memory module if the first interrupt signal is received, where the first memory module includes the first rank; record the first memory module if the second interrupt signal is received; determine a quantity of times of recording the first memory module; and if the quantity of times of recording the first memory module reaches the predetermined quantity of times, determine that a hardware fault occurs in the first memory module.

Optionally, in an embodiment, the first leaky bucket counter and the second leaky bucket counter are different leaky bucket counters, and the processor 530 is further configured to: record the first memory module if the first interrupt signal is received, where the first memory module includes the first rank and the second rank; record the first memory module if the second interrupt signal is received; determine a quantity of times of recording the first memory module; and if the quantity of times of recording the first memory module reaches a predetermined quantity of times, determine that a hardware fault occurs in the first memory module.

Optionally, in an embodiment, if it is determined that a hardware fault occurs in the first memory chip, the processor 530 is further configured to perform in-service replacement on the first memory chip.

Optionally, in an embodiment, the processor 530 is further configured to: before performing in-service replacement on the first memory chip, determine that a redundant memory chip exists in the first rank; and perform in-service replacement on the first memory chip by using the redundant memory chip.

Optionally, in an embodiment, if it is determined that a hardware fault occurs in the first rank, the processor 530 is further configured to perform in-service replacement on the first rank.

Optionally, in an embodiment, the processor 530 is further configured to: before performing in-service replacement on the first rank, determine that a redundant rank exists in a memory module in which the first rank is located; and perform in-service replacement on the first rank by using the redundant rank.

Optionally, in an embodiment, the processor 530 is further configured to reset the count value of the first leaky bucket counter to zero.

Optionally, in an embodiment, if it is determined that a hardware fault occurs in the first memory module, the processor 530 is further configured to give a fault alarm, where the fault alarm is used to indicate that a hardware fault occurs in the first memory module.

This application further provides a chip, and the chip includes a processor and a communications interface. The communications interface is configured to communicate with an external component, and the processor is configured to perform the memory fault detection method in the embodiments of this application.

Optionally, in an implementation, the chip may further include a storage, the storage stores an instruction, and the processor is configured to execute the instruction stored in the storage. When the instruction is executed, the processor is configured to perform the memory fault detection method in the embodiments of this application.

It should be understood that the chip may be integrated into a server, and is configured to perform memory fault detection on a memory in the server.

This application further provides a server, and the server includes a memory fault detection apparatus and a storage. The memory fault detection apparatus is configured to detect whether a hardware fault occurs in a memory in the storage, and the memory in the storage includes at least one of a memory module, a rank, and a memory chip. The memory fault detection apparatus may be specifically the apparatus 400 or the apparatus 500. The memory fault detection apparatus in the server may be equivalent to the control module 101 and the memory controller 102 in the server in FIG. 1, and is configured to detect whether a hardware fault occurs in a memory in the storage 103.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenience and brief description, for a detailed working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. The described apparatus embodiment is merely an example. For example, the unit division is merely logical function division and may be other division in actual implementation, such as a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions may be implemented in a form of a software product. The software product is stored in a storage medium, and includes several instructions for instructing a computer device (which may be a personal computer, a server, or a network device) to perform all or some of the steps of the methods described in the embodiments of this application. The foregoing storage medium includes: any medium that can store program code, such as a USB flash drive, a removable hard disk, a read-only memory (ROM), a random-access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method comprising:

receiving a first interrupt signal when a first count value of a first leaky bucket counter of a server reaches a first threshold, wherein the first leaky bucket counter counts a first correctable error occurring in a first memory rank corresponding to the first leaky bucket counter;

disabling an interrupt switch of the first leaky bucket counter in response to the first interrupt signal;

enabling the interrupt switch after the interrupt switch has been disabled for a preset time and the first count value resets to zero;

receiving a second interrupt signal when a second count value of a second leaky bucket counter of the server reaches a second threshold, wherein the second leaky bucket counter counts a second correctable error occurring in a second memory rank corresponding to the second leaky bucket counter; and identifying that a hardware fault has occurred in the first memory rank when the first leaky bucket counter and the second leaky bucket counter are the same leaky bucket counter and when the first memory rank and the second memory rank are the same memory rank.

2. The method of claim 1, wherein when the first leaky bucket counter and the second leaky bucket counter are the same leaky bucket counter and when the first memory rank and the second memory rank are the same memory rank, the method further comprises:

recording, each time the first interrupt signal is received, a memory chip that is in the first memory rank and that has the first correctable error;

recording, each time the second interrupt signal is received, the memory chip; and further determining that the hardware fault has occurred in the memory chip when a quantity of times of recording the memory chip reaches a predetermined quantity.

3. The method of claim 2, further comprising performing in-service replacement on the memory chip when the hardware fault has occurred.

4. The method of claim 3, wherein before performing the in-service replacement, the method further comprises:

determining that a redundant memory chip exists in the first memory rank; and further performing the in-service replacement on the memory chip using the redundant memory chip.

5. The method of claim 3, further comprising resetting the first count value to zero.

6. The method of claim 1, wherein when the first leaky bucket counter and the second leaky bucket counter are the same leaky bucket counter and when the first memory rank and the second memory rank are the same memory rank, the method further comprises:

recording the first memory rank each time the first interrupt signal is received;

recording the first memory rank each time the second interrupt signal is received; and further determining that the hardware fault has occurred in the first memory rank when a quantity of times of recording the first memory rank reaches a predetermined quantity.

7. The method of claim 1, wherein when the first leaky bucket counter and the second leaky bucket counter are the same leaky bucket counter and when the first memory rank and the second memory rank are the same memory rank, the method further comprises:

recording a first memory module each time the first interrupt signal is received, wherein the first memory module comprises the first memory rank;

recording the first memory module each time the second interrupt signal is received; and further determining that the hardware fault has occurred in the first memory module when a quantity of times of recording the first memory module reaches a predetermined quantity.

8. The method according to claim 7, giving a fault alarm when the hardware fault has occurred in the first memory module.

9. The method of claim 1, wherein the first leaky bucket counter and the second leaky bucket counter are different, and wherein the method further comprises:

recording a first memory module each time the first interrupt signal is received, wherein the first memory module comprises the first memory rank and the second memory rank;

recording the first memory module each time the second interrupt signal is received; and further determining that the hardware fault has occurred in the first memory module when a quantity of times of recording the first memory module reaches a predetermined quantity.

10. The method of claim 1, further comprising performing in-service replacement on the first memory rank when the hardware fault has occurred.

11. The method according to claim 10, wherein before performing the in-service replacement, the method further comprises:

determining that a redundant memory rank exists in a memory module in which the first memory rank is located; and further performing the in-service replacement on the first memory rank using the redundant memory rank.

12. A chip comprising:

a memory comprising instructions; and a processor coupled to the memory and configured to execute the instructions to:

receive a first interrupt signal when a first count value of a first leaky bucket counter of a server reaches a first threshold, wherein the first leaky bucket counter counts a first correctable error occurring in a first memory rank corresponding to the first leaky bucket counter;

disable an interrupt switch of the first leaky bucket counter in response to the first interrupt signal;

enable the interrupt switch after the interrupt switch has been disabled for a preset time and the first count value resets to zero;

receive a second interrupt signal when a second count value of a second leaky bucket counter of the server reaches a second threshold, wherein the second leaky bucket counter counts a second correctable error occurring in a second memory rank corresponding to the second leaky bucket counter; and determine that a hardware fault has occurred in the first memory rank when the first leaky bucket counter and the second leaky bucket counter are the same leaky bucket counter and when the first memory rank and the second memory rank are the same memory rank.

13. The chip of claim 12, wherein the processor is further configured to:

record, each time the first interrupt signal is received, a memory chip that is in the first memory rank and that has a correctable error;

record, each time the second interrupt signal is received, the memory chip; and further determine that the hardware fault has occurred in the memory chip when a quantity of times of recording the memory chip reaches a predetermined quantity.

14. The chip of claim 12, wherein the processor is further configured to:

record the first memory rank each time the first interrupt signal is received;

record the first memory rank each time the second interrupt signal is received; and further determine that the hardware fault has occurred in the first memory rank when a quantity of times of recording the first memory rank reaches a predetermined quantity.

15. The chip of claim 12, wherein the processor is further configured to:

record a first memory module each time the first interrupt signal is received, wherein the first memory module comprises the first memory rank;

record the first memory module each time the second interrupt signal is received; and further determine that the hardware fault has occurred in the first memory module when a quantity of times of recording the first memory module reaches a predetermined quantity.

16. The chip of claim 12, wherein the processor is further configured to:

record a first memory module each time the first interrupt signal is received, wherein the first memory module comprises the first memory rank and the second memory rank;

record the first memory module each time the second interrupt signal is received; and further determine that the hardware fault has occurred in the first memory module when a quantity of times of recording the first memory module reaches a predetermined quantity.

17. A server comprising:

a storage;

a memory controller coupled to the storage; and a control module coupled to the memory controller and configured to:

receive a first interrupt signal when a first count value of a first leaky bucket counter of the server reaches a first threshold, wherein the first leaky bucket counter counts a first correctable error occurring in a first memory rank corresponding to the first leaky bucket counter;

disable an interrupt switch of the first leaky bucket counter in response to the first interrupt signal;

enable the interrupt switch after the interrupt switch has been disabled for a preset time and the first count value resets to zero;

receive a second interrupt signal when a second count value of a second leaky bucket counter of the server reaches a second threshold, wherein the second leaky bucket counter counts a second correctable error occurring in a second memory rank corresponding to the second leaky bucket counter; and determine that a hardware fault has occurred in the first memory rank when the first leaky bucket counter and the second leaky bucket counter are the same leaky bucket counter and when the first memory rank and the second memory rank are the same memory rank.

18. The server of claim 17, wherein the control module is further configured to:

record, each time the first interrupt signal is received, a memory chip that is in the first memory rank and that has a correctable error;

record, each time the second interrupt signal is received, the memory chip; and further determine that the hardware fault has occurred in the memory chip when a quantity of times of recording the memory chip reaches a predetermined quantity.

19. The server of claim 17, wherein when the first leaky bucket counter and the second leaky bucket counter are the same leaky bucket counter and when the first memory rank and the second memory rank are the same memory rank, the control module is further configured to:

record the first memory rank each time the first interrupt signal is received;

record the first memory rank each time the second interrupt signal is received; and further determine that the hardware fault has occurred in the first memory rank when a quantity of times of recording the first memory rank reaches a predetermined quantity.

20. The server of claim 17, wherein when the first leaky bucket counter and the second leaky bucket counter are the same leaky bucket counter and when the first memory rank and the second memory rank are the same memory rank, the control module is further configured to:

record a first memory module each time the first interrupt signal is received, wherein the first memory module comprises the first memory rank;

record the first memory module each time the second interrupt signal is received; and further determine that the hardware fault has occurred in the first memory module when a quantity of times of recording the first memory module reaches a predetermined quantity.

* * * * *